United States Patent
Norrgrann et al.

(10) Patent No.: US 7,048,248 B1
(45) Date of Patent: May 23, 2006

(54) FIXTURE AND LOADING METHOD FOR PVD COATING OF CUTTING TOOL INSERTS

(75) Inventors: Tor Norrgrann, Huddinge (SE); Ingemar Hessman, Sandviken (SE)

(73) Assignee: Sandvik Intellectual Property AB, Sandviken (SE)

( * ) Notice: Subject to any disclaimer, the term of this patent is extended or adjusted under 35 U.S.C. 154(b) by 665 days.

(21) Appl. No.: 10/019,778

(22) PCT Filed: Jul. 4, 2000

(86) PCT No.: PCT/SE00/01416

§ 371 (c)(1),
(2), (4) Date: Jul. 3, 2002

(87) PCT Pub. No.: WO01/02620

PCT Pub. Date: Jan. 11, 2001

(30) Foreign Application Priority Data

Jul. 5, 1999 (SE) .................................. 9902574

(51) Int. Cl.
*C23C 14/50* (2006.01)
(52) U.S. Cl. .................... 248/683; 118/500; 204/192.1
(58) Field of Classification Search ............. 204/192.1; 118/500; 248/683
See application file for complete search history.

(56) References Cited

U.S. PATENT DOCUMENTS

| | | | | | |
|---|---|---|---|---|---|
| 2,939,671 | A | * | 6/1960 | Beekman | 248/683 |
| 3,660,949 | A | * | 5/1972 | Coes, Jr. | 451/364 |
| 4,420,386 | A | * | 12/1983 | White | 427/526 |
| 4,837,540 | A | * | 6/1989 | Michele et al. | 335/286 |
| 5,557,487 | A | * | 9/1996 | Elsaesser et al. | 360/99.08 |
| 5,576,058 | A | | 11/1996 | Norrgrann et al. | |
| 5,618,449 | A | * | 4/1997 | Houman et al. | 219/69.11 |
| 5,667,343 | A | | 9/1997 | Hessman et al. | |
| 6,523,443 | B1 | * | 2/2003 | Hof et al. | 82/1.4 |
| 6,581,259 | B1 | * | 6/2003 | Yoshikawa et al. | 29/33 R |

FOREIGN PATENT DOCUMENTS

| | | |
|---|---|---|
| DE | 198 21 019 A1 | 11/1999 |
| JP | 4000372 A | 1/1992 |

* cited by examiner

*Primary Examiner*—Bret Chen
(74) *Attorney, Agent, or Firm*—Drinker, Biddle & Reath LLP

(57) ABSTRACT

A method of loading cutting tool inserts in a PVD (Physical Vapor Deposition) coating equipment consists in using a tube manufactured of a non-magnetic metallic material surrounding a stack of alternating discs of a magnetic material and iron. The north poles of the magnets are directed towards each other and the cutting inserts are positioned on the outer wall of the solid tube and kept in place by the magnetic forces.

9 Claims, 2 Drawing Sheets

D

A

E

C

B

FIXTURE AND LOADING METHOD FOR PVD COATING OF CUTTING TOOL INSERTS

FIELD OF THE INVENTION

The present invention relates to a PVD (Physical Vapour Deposition) batch fixturing system for cutting inserts, suitable for rational large scale production and allowing for fully automatic loading.

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

Physical Vapour Deposition of wear resistant hard coatings on cemented carbide cutting inserts has been in industrial use for more than 15 years and the practice of the PVD method is still increasing as is the number and variety of products subjected to this process.

The PVD process is, in contrast to CVD (Chemical Vapour Deposition), a line-of-sight process with limited ability to achieve an equal coating thickness around a three-dimensional body such as a cutting insert. This fact requires special arrangements for the fixturing system, the cutting edges of the individual cemented carbide cutting insert, as well as the cutting edges of all the inserts in the entire batch must be as equally exposed to the flux of the coating material as possible. Preferably, the largest coating thickness is to be found on that part of the insert where it is most required for the particular cutting operation to be carried out. Furthermore, the rake face and the clearance face of the insert must both be subjected to the least possible effect of shadowing from the surrounding cutting inserts. These requirements may lead to a low loading density of inserts if not specifically designed loading fixtures are being used. A further complication is introduced when the cutting inserts do not possess any holes in the center which would enable hanging them on an arrangement of hooks.

There are several methods for loading inserts without holes available but two main principles can be distinguished:

(i) locking the inserts in mechanical fixtures and keeping them in a desired position, e.g.—with slits or arms;

(ii) fixturing the inserts on magnetic holders allowing for the magnetic forces to keep the inserts in a fixed position during the deposition process.

The limitation of method (i), mechanically locking the inserts in fixed positions, is the risk that the locking device itself will shadow an area of the insert that should be coated. The shadowing effect may cause an undesired variation in the coating thickness or, in the worst case, areas that are almost without a coating. It is a disadvantage in cutting operations if the areas with thinner or absent coatings are located within the depth-of-cut area on the insert tool edge. The cosmetic appearance of the insert may also become undesirable with marks and fluctuations in color that are not the same and alike on all the inserts.

The limitation of method (ii), magnetic holders, is the weight of the magnets, which is significant. The high weight of the magnet assembly will restrict the functionality of the mechanism used to rotate the batch in the PVD coating chamber. The rotation is required in order to achieve as equal coating conditions as possible on all the material in the batch. The area of the insert, which is in contact with the magnet, will inevitably remain without a coating restricting the method to be best suited for inserts that may be allowed to have one side or one part of a side without a coating. Furthermore, one requirement of the inserts' geometrical shape would be that of a flat bottom surface to obtain a large enough contact area to the magnet in order to maximize the magnetic force keeping the inserts in place. The magnetic field strength decreases with increasing temperature and the typical PVD substrate temperature range of 450–500° C., also puts specific requirements on the type of magnets that are to be used for this purpose.

A common practice in the prior art is to fixture the inserts side by side on a four- or six-folded pole. Each side of the pole having an area that allows several inserts to be placed in a two-dimensional pattern. This results in an unfavourable coating thickness distribution. As a consequence of the rotation of the pole, the clearance faces of the inserts placed along the vertical border of a face of the pole, will obtain thicker coatings than all the other clearance faces of the inserts placed on the same side of the pole. Furthermore, the parallel positioning of the inserts will cause a shadowing effect on the clearance faces of the inserts, causing a difference in coating thickness between the rake and clearance faces of the inserts. This difference is in certain cases most undesirable in cutting operations.

SUMMARY OF THE INVENTION

It is an object of this invention to provide a fixture system, especially suited for cutting inserts of a specific geometrical shape, of magnetic holders avoiding or alleviating the general limitations of a loading system based on the magnetic principle. Furthermore, it is an object of the invention to provide a loading system suitable for a rational production on a larger scale.

According to one aspect, the present invention provides a method of fixturing cutting tool inserts in Physical Vapor Deposition coating equipment, the method comprising: providing a tube of a non-magnetic metallic material having an outer wall surrounding a stack of alternating discs of a magnetic material and iron, north poles of the magnets are directed towards each other; positioning the cutting inserts on the outer wall of the tube; and retaining the cutting inserts by magnetic forces.

DETAILED DESCRIPTION OF THE INVENTION

Figure 1:
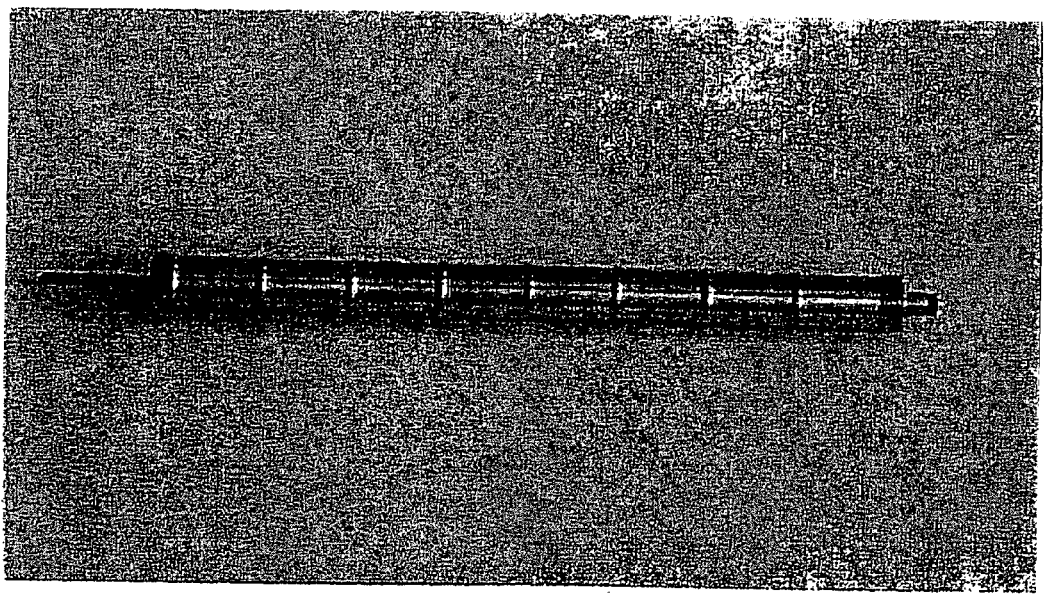
FIG. 1 shows a picture of the presently claimed invention.
Figure 2:
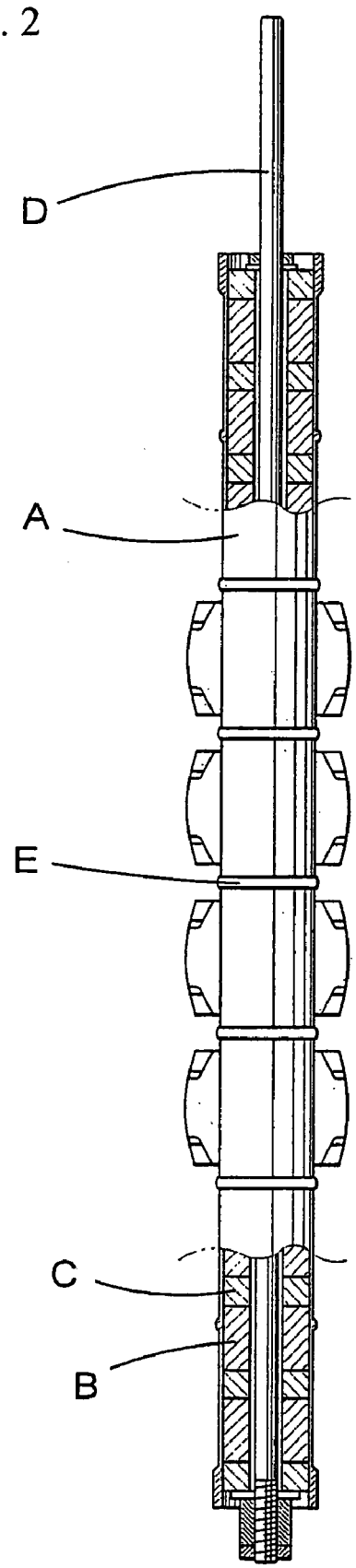
FIG. 2 shows a schematic partial cutaway view of an embodiment of the presently claimed invention.
Figure 3:
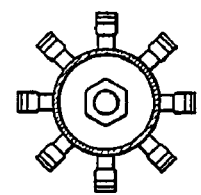
FIGS. 3 and 4 display cross-sections of the invented construction with cemented carbide inserts loaded in with different loading densities.
Figure 4:
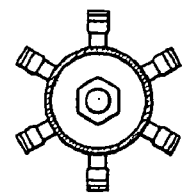

As illustrated in FIGS. 2–4, the invention includes a metallic tube (A) encompassing a stack of alternating discs of magnets (B) and iron cores (C). A bar (D) passes through the centre of the magnets and iron cores. The bar is adapted to conform to the rotating construction in the PVD-equipment. The tube is further equipped with reinforcement rings (E).

The batch loading system according to the present invention utilizes a tube manufactured of a non-magnetic metallic material, surrounding a stack of alternating discs of magnets and iron discs. The cutting inserts are placed on the outer wall of the solid tube and kept in place by the magnetic forces.

The physical shape of the outer tube in the present invention may be designed in a number of geometrical shapes. The cross-section of the tube may for instance be circular, elliptical, rectangular, quadratic, pentagonal, hexagonal and so on. In the description of the present invention only the circular cross-section will be described.

The circular shape of the fixture makes it specifically suited for loading inserts with a specific geometrical shape. The part of the insert in contact with the tube should preferably have an elongated geometry. One type of inserts that does not possess any central hole and has an elongated bottom surface that is not used in the cutting operation, and which requires an even coating thickness on the rake and the clearance faces, are inserts used for machining operations called parting and grooving. Inserts of this type and other types of inserts with similar qualities are especially suited for the present invention.

FIGS. 3–4 show that the cylindrical shape of the tube leads to an improved exposure of the clearance faces in comparison to the inserts being positioned in parallel on a flat surface. The elongated bottom profile of the insert assures a firm contact with the tube. The tubular shape optimizes the ratio between surface area available for loading and volume of magnetic material. Thus, the weight of the fixture is minimized at the same time as the surface area of the fixture is maximized and a high loading density of inserts is allowed.

The arrangement of the magnets is important to the functionality of the loading system. The magnets are orientated with the north poles towards each other. In this way the magnetic field in the iron disc will be amplified and the effect of the magnets is used in an optimal way. The thickness of the magnetic discs in comparison with the thickness of the iron discs is also of importance. The iron disc must be thick enough to act as a buffer between the magnetic fields from the surrounding magnetic discs and thick enough to avoid saturation in magnetic flux. At the same time the iron disc has to be thin enough to avoid self-demagnetisation of the magnets.

The type of magnetic material being used is critical since many of the magnetic materials loose their magnetic properties at elevated temperatures. The material in the iron discs is preferably an iron material with a low content of alloying elements.

The metallic tube should be manufactured of a nonmagnetic material, such as for instance stainless steel, in order not to disturb the magnetic flux from the magnetic discs to iron discs. The function of the metallic tube surrounding the magnets is primarily to protect the magnets from physical damage and from being coated. A coated surface will after a number of exposures to the coating process begin to loose particles of the coating. These particles will to a certain extent become attached to the inserts being coated at the time and will form defects on these inserts. Such defects may be detrimental to the performance properties of the insert if the defects are located in an area of the cutting edge being used during the cutting operation. The protective tube is easily removed after a number of deposition cycles and replaced with a new one or, if desired, the tube might be subjected to a cleaning operation such as blasting.

The metallic tube, however, will attenuate the magnetic field. In a preferred embodiment, the thickness of the tube is reduced to less than 1.5 mm, preferably less than 1.0 mm.

The present invention is suitable for automatic loading of the inserts on the tube. In a preferred embodiment the tube is equipped with reinforcement rings, protruding some tenths of a mm from the outer surface of the tube, at intervals along the vertical axis. This is a precaution in order to also allow for a somewhat harsh treatment of the tube during loading and unloading. The objective of the enhancements is to prevent the inserts from slipping down the tube.

In the foregoing description details have been given. However, the exact conditions and optimal dimensions of the details encompassed by the invention will to a certain extent depend on the design of the coating equipment and deposition conditions used.

While the present invention has been described by reference to the above-mentioned embodiments, certain modifications and variations will be evident to those of ordinary skill in the art. Therefore, the present invention is limited only by the scope and spirit of the appended claims.

The invention claimed is:

1. A method of loading cutting tool inserts in Physical Vapor Deposition coating equipment, the method comprising:
   providing a tube of a non-magnetic metallic material having an outer wall surrounding a stack of alternating discs of a magnetic material and iron, north poles of the magnets are directed towards each other;
   positioning the cutting inserts on the outer wall of the tube; and
   retaining the cutting inserts by magnetic forces.

2. The method according to claim 1, wherein the tube has a circular cross-section.

3. The method according to claim 1, wherein the tube has a wall thickness of less than 1.5 mm.

4. The method according to claim 1, wherein the tube has a wall thickness of less than 1.0 mm.

5. A fixture for use in magnetically holding tools during a coating process, the fixture comprising:
   a tube of a non-magnetic metallic material;
   a stack of discs disposed within the tube, the stack comprising alternating discs of magnetic material and iron.

6. The fixture of claim 5, wherein the tube has an outer wall adapted to retain one or more cutting inserts by magnetic force thereon.

7. The fixture of claim 5, wherein the north poles of the magnets are directed towards each other.

8. A fixture for holding cutting tool inserts in Physical Vapor Deposition coating equipment, comprising:
   a tube of a non-magnetic metallic material, at least a portion of the external surface of the tube being adapted to receive and retain cutting inserts thereon by magnetic force;
   a stack of discs disposed within the tube, the stack comprising alternating discs of magnetic material and iron.

9. The fixture of claim 8, wherein the north poles of the magnets are directed towards each other.

* * * * *